US009780698B2

(12) United States Patent
Lee et al.

(10) Patent No.: US 9,780,698 B2
(45) Date of Patent: Oct. 3, 2017

(54) PIEZOELECTRIC ENERGY HARVESTING ARRAY AND METHOD OF MANUFACTURING THE SAME

(71) Applicant: ELECTRONICS AND TELECOMMUNICATIONS RESEARCH INSTITUTE, Daejeon (KR)

(72) Inventors: Sang Kyun Lee, Gwangju (KR); Moonkeun Kim, Gyeonggi-do (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 9 days.

(21) Appl. No.: 15/018,906

(22) Filed: Feb. 9, 2016

(65) Prior Publication Data

US 2016/0173006 A1 Jun. 16, 2016

Related U.S. Application Data

(62) Division of application No. 13/845,842, filed on Mar. 18, 2013, now Pat. No. 9,294,015.

(30) Foreign Application Priority Data

May 25, 2012 (KR) .................. 10-2012-0056242
Dec. 21, 2012 (KR) .................. 10-2012-0151127

(51) Int. Cl.
*H02N 2/00* (2006.01)
*H02N 2/18* (2006.01)
(Continued)

(52) U.S. Cl.
CPC ............ *H02N 2/186* (2013.01); *H01L 41/04* (2013.01); *H02N 2/188* (2013.01); *H02N 2/22* (2013.01); *H01L 41/1136* (2013.01); *Y10T 29/42* (2015.01)

(58) Field of Classification Search
CPC .......... H02N 2/186; H02N 2/188; H02N 2/22; H01L 41/1136; H01L 41/04
(Continued)

(56) References Cited

U.S. PATENT DOCUMENTS 5,072,288 A * 12/1991 MacDonald ........... B82Y 15/00
310/330
7,088,031 B2  8/2006 Brantner et al.
(Continued)

OTHER PUBLICATIONS

Jing-Quan Liu et al., "A MEMS-based piezoelectric power generator array for vibration energy harvestinq", Microelectronics Journal, May 2008, pp. 802-806, vol. 39, No. 5.*
(Continued)

*Primary Examiner* — Thomas Dougherty
*Assistant Examiner* — Karen B Addison
(74) *Attorney, Agent, or Firm* — Rabin & Berdo, P.C.

(57) ABSTRACT

The inventive concept discloses a piezoelectric energy harvesting array and a method of manufacturing the same. The manufacturing method may include forming a plurality of piezoelectric energy harvesting devices; connecting masses to one side of the piezoelectric energy harvesting devices and connecting the other side of the piezoelectric energy harvesting devices facing the masses to a base; and individually tuning a resonant frequency of each of the piezoelectric energy harvesting devices to prevent mismatch of resonant frequency when the masses vibrate.

5 Claims, 5 Drawing Sheets

(51) Int. Cl.
*H01L 41/04* (2006.01)
*H01L 41/113* (2006.01)

(58) Field of Classification Search
USPC ........ 310/319, 329, 330, 332, 331, 370, 339
See application file for complete search history.

(56) References Cited

U.S. PATENT DOCUMENTS

| | | | | |
|---|---|---|---|---|
| 7,414,351 | B2* | 8/2008 | Ulm | B60C 23/0411 |
| | | | | 310/330 |
| 7,687,977 | B2* | 3/2010 | Xu | H01L 41/1136 |
| | | | | 310/331 |
| 8,120,232 | B2* | 2/2012 | Daniel | G01L 1/16 |
| | | | | 310/330 |
| 8,963,404 | B2* | 2/2015 | Lee | H01L 41/1136 |
| | | | | 310/370 |

OTHER PUBLICATIONS

Jing-Quan Liu et al., "A MEMS-based piezoelectric power generator array for vibration energy harvesting", Microelectronics Journal, vol. 39, No. 5, pp. 802-806, May 2008.

* cited by examiner

PIEZOELECTRIC ENERGY HARVESTING ARRAY AND METHOD OF MANUFACTURING THE SAME

CROSS-REFERENCE TO RELATED APPLICATIONS

This is a division of application Ser. No. 13/845,842, filed Mar. 18, 2013. Further, this U.S. non-provisional patent application claims priority under 35 U.S.C. §119 of Korean Patent Application Nos. 10-2012-0056242, filed on May 25, 2012, and 10-2012-0151127, filed on Dec. 21, 2012. The entire contents of these prior applications are hereby incorporated by reference.

BACKGROUND

The present inventive concept herein relates to energy harvesting power supply devices, and more particularly, to a piezoelectric energy harvesting array including a plurality of piezoelectric energy harvesting devices and a method of manufacturing the same.

Recently, because of the development of electrical communication technology, various kinds of electronic devices are being appeared. For example, as an electronic device such as portable electronic equipments realizes a user oriented ubiquitous computing, the demand for the portable electronic equipment is explosively being increased. Portable electronic equipments may include a portable power supply such as a battery. Since a battery technology is one-short thing or needs a periodic charge, it has limitation. In an electronic device, the need of energy harvesting has come to the fore.

A kinetic energy harvesting means a technology that can convert mechanical energy being abandoned such as the vibration of train, the vibration of vacuum pump, the vibration of machines and motors, the vibration of vehicle engine, and the vibration of human action into electrical energy. A piezoelectric energy harvesting (PEH) device is a kind of transducer. If a resonant frequency of piezoelectric energy harvesting device matches a frequency of neighboring vibration, displacement amplification is generated and thereby the highest electrical energy is generated at the resonant frequency.

A voltage being generated from the kinetic energy harvesting device is output in the form of alternating current (AC). AC voltage can be converted into a direct current (DC) to be used. DC voltage charges a super capacitor or battery and is used to drive an integrated circuit (IC). However, since electrical energy obtained from vibration being generated from the surrounding environment is very small, it is not sufficient as electric power for driving an integrated circuit. Thus, a method of optimizing a size or shape of energy harvesting device or a method of increasing an output using a multilayer structure has been studied.

Since a piezoelectric ceramic device has a brittle characteristic, it is weak to the impact and has a limit of increasing its size. In case of using a multilayer structure, since a manufacturing process is not established, it is not suited to use the multilayer structure in the manufacture of the PEH device. As another method of increasing an output of the piezoelectric energy harvesting device, there is a method of using single crystal having high coupling efficiency and a great piezoelectric constant. In this case, it is very difficult to make the single crystal into a multilayer structure.

As a method to solve the above problem, method using a piezoelectric energy harvesting array may be suggested. To match a resonant frequency of piezoelectric energy harvesting (PEH) device to a neighboring frequency (e.g., 1-120 Hz), a method of using tip mass of end of cantilever after optimizing a shape or size of the piezoelectric energy harvesting (PEH) device is frequently used.

SUMMARY

Embodiments of the inventive concept provide a method of manufacturing a piezoelectric energy harvesting array. The method may include forming a plurality of piezoelectric energy harvesting devices; connecting masses to one side of the piezoelectric energy harvesting devices and connecting the other side of the piezoelectric energy harvesting devices facing the masses to a base; and individually tuning a resonant frequency of each of the piezoelectric energy harvesting devices to prevent mismatch of resonant frequency when the masses vibrate.

Embodiments of the inventive concept also provide a piezoelectric energy harvesting array. The piezoelectric energy harvesting array may include a base; a plurality of piezoelectric energy harvesting devices clamped to the base; masses clamped to end parts of the plurality of piezoelectric energy harvesting devices facing the base; and additive masses which adhere to the masses to tune resonant frequencies of the piezoelectric energy harvesting devices when the masses vibrate.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
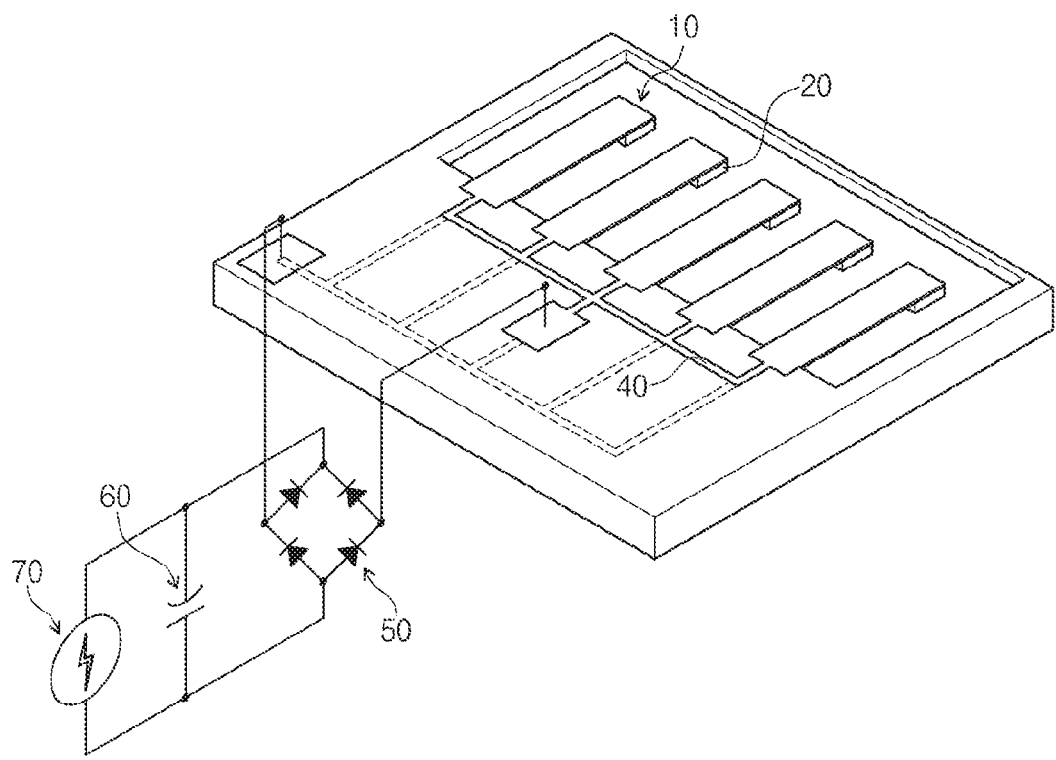
FIGS. 1 and 2 are perspective views illustrating a piezoelectric energy harvesting array in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Figure 2:
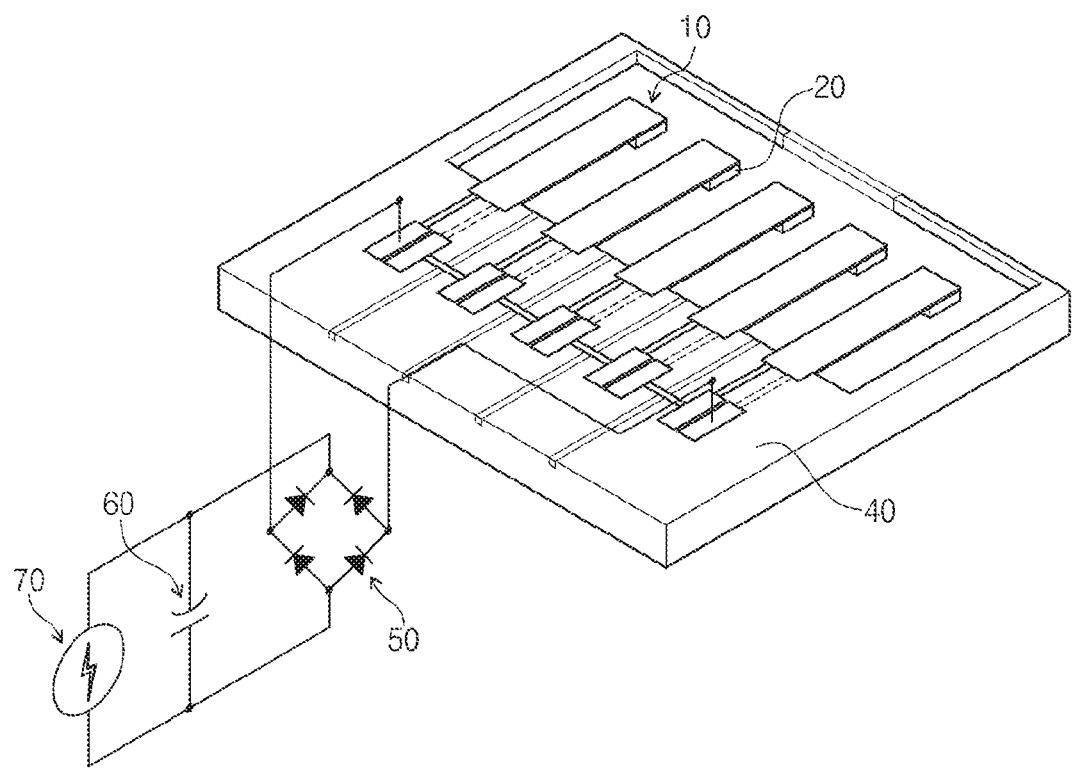

FIGS. 1 and 2 are perspective views illustrating a piezoelectric energy harvesting array in accordance with some embodiments of the inventive concept.

Figure 3:
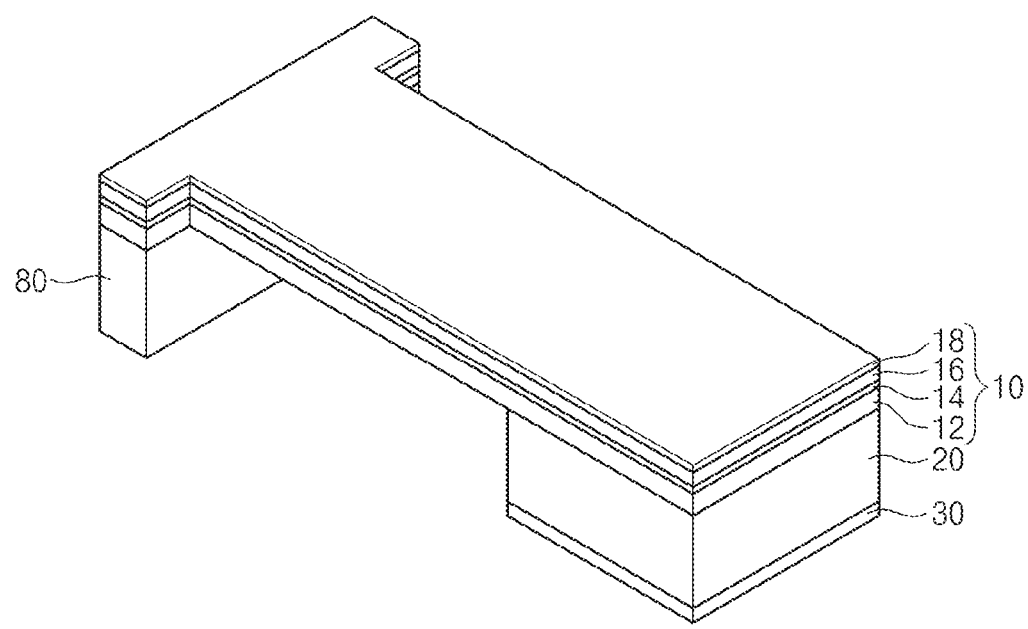
FIG. 3 is a perspective view illustrating a piezoelectric energy harvesting device of FIGS. 1 and 2.

FIG. 3 is a perspective view illustrating a piezoelectric energy harvesting device of FIGS. 1 and 2.

Referring to FIGS. 1 through 3, the piezoelectric energy harvesting array may include piezoelectric energy harvesting devices 10, mass 20, an additive mass 30, a wire 40, a rectifier 50, a storage device 60, a load 70 and a base 80.

The piezoelectric energy harvesting devices 10 can convert an external vibration into an electric energy. One side of the piezoelectric energy harvesting devices 10 is fixed to the base 80 and the other side of the piezoelectric energy harvesting devices 10 is loaded to the masses 20. The piezoelectric energy harvesting devices 10 may be constituted by a piezoelectric monomorph, a piezoelectric bimorph or a piezoelectric multimorph. The piezoelectric monomorph may include a shim 12, a first electrode layer 14, a piezoelectric layer 16 and a second electrode layer 18. The first and second electrode layers 18 may include metal such as copper, gold, silver, aluminum, tungsten, molybdenum or nickel. The piezoelectric layer 16 may include PZT, PMN-PT, PZN-PT, PMN-PZT or MFC (micro-fiber composite). Although not illustrated in the drawing, in the piezoelectric bimorph, a plurality of piezoelectric layers 16 may be disposed on and under the shim 12 respectively. A plurality of first electrode layers 14 and second electrode layers 18 may be disposed under and on the plurality of piezoelectric layers 16. The piezoelectric energy harvesting devices 10 may have the piezoelectric layers 16 of multilayer.

The masses 20 give vibration to the piezoelectric energy harvesting devices 10. Weight of the masses 20 may be changed depending on a resonant frequency of the piezoelectric energy harvesting devices 10. The additive mass 30 may adhere to the mass 20. The additive mass 30 may include adhesive.

The electrical wire 40 connects the piezoelectric energy harvesting devices 10 to the rectifier 50. For example, the number of piezoelectric energy harvesting devices 10 is five and the piezoelectric energy harvesting devices 10 are connected to each other in parallel or in series. However, the present inventive concept is not limited thereto. The piezoelectric energy harvesting devices 10 illustrated in FIG. 1 are connected to each other in parallel. The piezoelectric energy harvesting devices 10 illustrated in FIG. 2 are connected to each other in series. The wire 40 of FIG. 2 may connect the piezoelectric energy harvesting devices 10 to each other in series. In the case that the piezoelectric energy harvesting devices 10 are connected to each other in parallel, an output current may increase. In the case that the piezoelectric energy harvesting devices 10 are connected to each other in series, an output voltage may increase.

The rectifier 50 can convert an alternating voltage being output from the piezoelectric energy harvesting devices 10 into a direct voltage. The storage device 60 can store a direct voltage. The storage device 60 may include capacitor or battery. The load 70 may include an electrical circuit which consumes electric power. The base 80 may be a fixed end of the piezoelectric energy harvesting devices 10.

Figure 4:
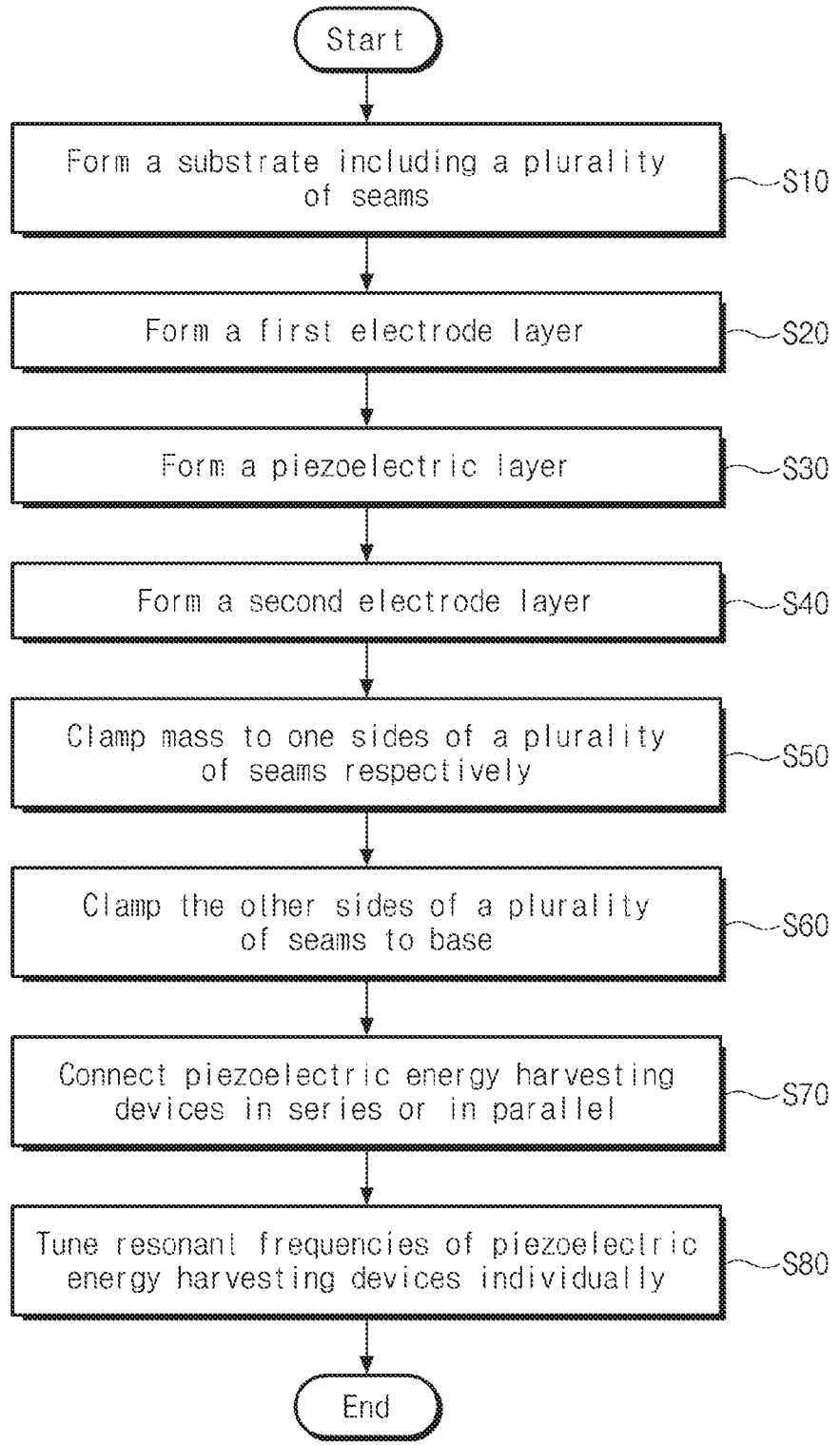
FIG. 4 is a flow chart illustrating a method of manufacturing a piezoelectric energy harvesting array.

FIG. 4 is a flow chart illustrating a method of manufacturing a piezoelectric energy harvesting array.

Referring to FIGS. 1 through 4, the piezoelectric energy harvesting devices 10 are formed. The piezoelectric energy harvesting devices 10 may be formed by a method as follows. The shim 12 of a substrate 11 is formed (S10). The first electrode layer 14 is formed on the shim 12 (S20). The first electrode layer 14 may adhere to the substrate 11 by adhesive such as epoxy. The piezoelectric layer 16 is formed on the first electrode layer 14 (S30). The piezoelectric layer 16 may be fixed to the first electrode layer 14 by conductive epoxy. The second electrode layer 18 is formed on the piezoelectric layer 16 (S40). The second electrode layer 18 may adhere to the piezoelectric layer 16 by conductive epoxy or deposition method. In case of using bulk piezoelectric, gold or silver electrodes may be deposited.

The masses 20 are connected to one side of the piezoelectric energy harvesting devices 10 (S50). The masses 20 may be fixed to one side tip of the piezoelectric energy harvesting devices 10 by screw or epoxy.

The base is connected to the other side of the piezoelectric energy harvesting devices 10 (S60). The piezoelectric energy harvesting devices 10 may be fixed to the base 80 by screw or epoxy. The step S60 may be performed before the step S50 is performed.

Although it is assumed that all lengths of the piezoelectric energy harvesting devices 10 are the same and all distances between the base 80 and the masses 20 are the same, all resonant frequencies of the piezoelectric energy harvesting devices 10 may not be the same.

The piezoelectric energy harvesting devices 10 are connected to each other in parallel or in series by the wire (S70). In the piezoelectric energy harvesting devices 10 connected in parallel, the first electrode 14 and the second electrode 18 may be connected in common In the piezoelectric energy harvesting devices 10 connected in series, the first electrode 14 and the second electrode 18 may be sequentially connected.

To prevent mismatch of resonant frequencies when the masses 20 vibrates, resonant frequencies of the piezoelectric energy harvesting devices 10 are separately tuned (S80). A separate tuning of resonant frequencies of the piezoelectric energy harvesting devices 10 may be performed as follows. Any one of the piezoelectric energy harvesting devices 10 is selected and the rest are fixed to the base 80. The rest of piezoelectric energy harvesting devices 10 may be fixed to the base by sponge, cotton or jig. The selected piezoelectric energy harvesting device 10 is tuned to a reference frequency of the base 80. The reference frequency may correspond to a resonant frequency.

When the piezoelectric energy harvesting devices 10 are constituted by an array, the piezoelectric energy harvesting devices 10 may have two frequencies. One is a resonant frequency (hereinafter it is referred to as 'sc resonant frequency') of a short circuit state that resistance converges on zero. At this time, impedance of the piezoelectric energy harvesting devices 10 may have a minimum value. The other one is a resonant frequency (hereinafter it is referred to as 'oc resonant frequency') of an open circuit state that resistance increases to infinity. At this time, impedance of the piezoelectric energy harvesting devices 10 may have the maximum value. The two resonant frequencies are determined by an effective electromechanical coupling coefficient. For example, a piezoelectric ceramic has a small effective electromechanical coupling coefficient and a piezoelectric single crystal has a great value to the nearest 1 (efficiency that converts mechanical energy into electrical energy=100%).

A current or voltage of each of the piezoelectric energy harvesting devices 10 may be measured at its end part Impedance of the piezoelectric energy harvesting devices 10 connected to each other in parallel may be defined by a mathematical formula 1.

$$R_L = \frac{1}{2\pi f \cdot C_p} \quad \text{[mathematical formula 1]}$$

Herein, f is a frequency and $C_p$ is a piezoelectric capacitance. The whole capacitance value of the piezoelectric energy harvesting devices 10 may be represented by a mathematical formula 2.

$$C_{pt}=C_{p1}+C_{p2}+\ldots+C_{pn} \quad \text{[mathematical formula 2]}$$

Herein, $C_{pt}$ means the whole capacitance value and $C_{pn}$ is an individual capacitance value. Since impedance of the piezoelectric energy harvesting array connected in parallel becomes very smaller than impedance of individual device, resonant frequencies of the piezoelectric energy harvesting devices 10 has to be tuned to the sc resonant frequency. In the case that resonant frequencies of the piezoelectric energy harvesting devices 10 are tuned to the oc resonant frequency, due to a difference of effective coupling coefficient of individual devices, a difference between sc resonant frequency and oc resonant frequency may be generated. Reduction of output electric power may be generated due to their difference.

Figure 5:
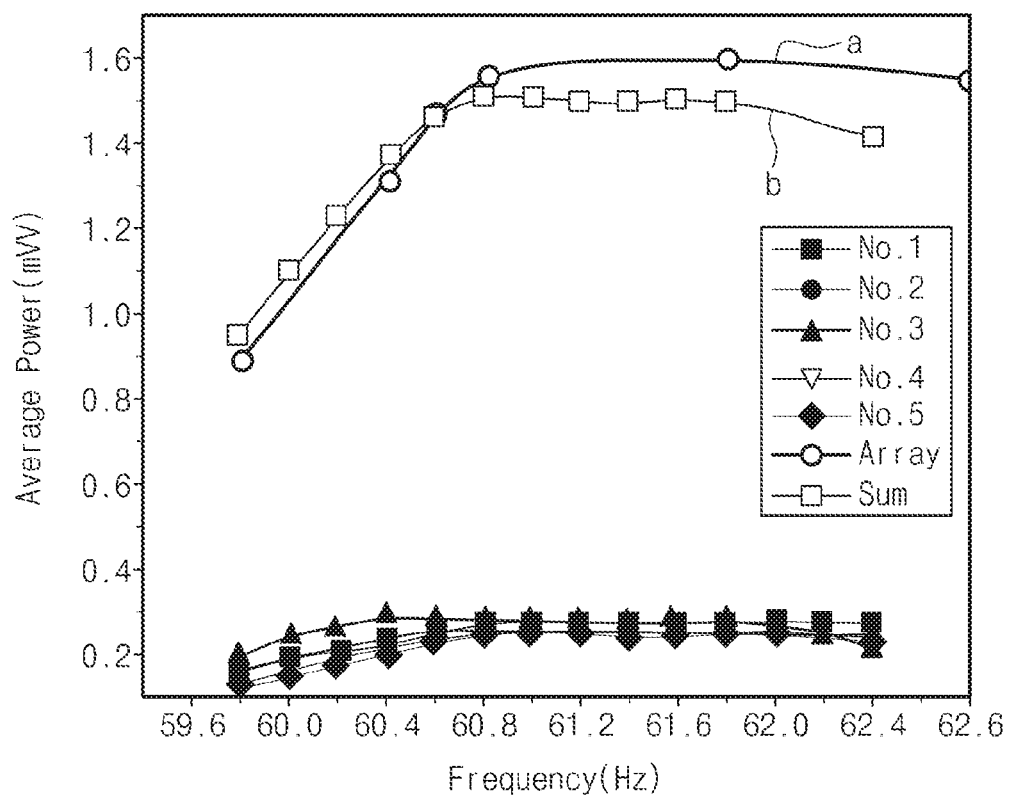
FIG. 5 is a graph illustrating an average output power relative to a resonant frequency of a piezoelectric energy harvesting array connected to each other in parallel.

FIG. 5 is a graph illustrating an average output power relative to a resonant frequency of a piezoelectric energy harvesting array connected to each other in parallel.

Referring to FIGS. 2 and 5, since output saturation is not generated the piezoelectric energy harvesting array in accordance with some embodiments of the inventive concept, output electric power (current) may be increased which is in proportion to the number of piezoelectric energy harvesting devices 10(a). This means that electrical energy loss of the piezoelectric energy harvesting devices 10 is minimized The number of piezoelectric energy harvesting devices 10 of parallel circuit which is tuned to a conventional open circuit resonant frequency, output saturation is generated and thereby output electric power is reduced (b). Thus, the piezoelectric energy harvesting array and the method of manufacturing the same in accordance with the inventive concept can provide high output power.

Since in the piezoelectric energy harvesting devices 10 connected in series, impedance difference between the individual device and the array is little, the piezoelectric energy harvesting devices 10 may be tuned to the sc resonant frequency or the oc resonant frequency if necessary. The piezoelectric energy harvesting devices 10 may individually vibrate. In a state that one of the piezoelectric energy harvesting devices 10 vibrates and the rest do not vibrate, impedance of the vibrating piezoelectric energy harvesting device 10 may be tuned. The rest of the piezoelectric energy harvesting devices 10 may be fixed toward the same direction by sponge, cotton or jig.

As described above, the method of manufacturing the piezoelectric energy harvesting array in accordance with some embodiments of the inventive concept can prevent mismatching of resonant frequency due to vibration of masses by tuning a plurality of piezoelectric energy harvesting devices connected to each other in parallel or in series. Piezoelectric energy harvesting devices connected to each other in parallel may be tuned to a short circuit resonant frequency. Output power of a piezoelectric energy harvesting array tuned to the short circuit resonant frequency may increase. Loss of electric energy of the piezoelectric energy harvesting devices may be minimized Thus, the piezoelectric energy harvesting array and the method of manufacturing the same may provide high output power.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A piezoelectric energy harvesting array comprising:
a base;
a plurality of piezoelectric energy harvesting devices clamped to the base;
masses clamped to end parts of the plurality of piezoelectric energy harvesting devices facing the base; and
additive masses which adhere to the masses, the additive masses being so arranged that each piezoelectric energy harvesting device is individually tuned to a reference frequency of the base by one of the additive masses corresponding thereto, to thereby prevent resonant frequency mismatch when the masses vibrates.

2. The piezoelectric energy harvesting array of claim 1, wherein the additive masses comprise adhesive.

3. The piezoelectric energy harvesting array of claim 1, wherein the piezoelectric energy harvesting devices comprise a piezoelectric unimorph or a piezoelectric bimorph.

4. The piezoelectric energy harvesting array of claim 1, wherein the unimorph comprises:
a substrate including a plurality of shims;
a first electrode layer on the substrate;
a piezoelectric layer on the first electrode layer; and
a second electrode layer on the piezoelectric layer.

5. The piezoelectric energy harvesting array of claim 1, further comprising a rectifier connected to the plurality of piezoelectric energy harvesting devices in series or in parallel.

* * * * *